(12) United States Patent
Kim

(10) Patent No.: US 6,387,738 B2
(45) Date of Patent: May 14, 2002

(54) METHOD FOR MANUFACTURING A THIN FILM TRANSISTOR

(75) Inventor: Hye-dong Kim, Seongnam (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/731,756

(22) Filed: Dec. 8, 2000

(30) Foreign Application Priority Data

Dec. 8, 1999 (KR) .............................................. 99-55687

(51) Int. Cl.⁷ .............................................. H01L 21/00
(52) U.S. Cl. ........................ 438/151; 438/163; 438/181; 438/195
(58) Field of Search ................................ 438/155, 163, 438/181, 195, 197, 145, 160; 257/66, 270, 347, 365, 315, 342; 349/42, 46, 139, 43

(56) References Cited

U.S. PATENT DOCUMENTS

| | | | |
|---|---|---|---|
| 5,793,058 A | * | 8/1998 | Han et al. ....................... 257/66 |
| 5,885,859 A | * | 3/1999 | Han et al. ..................... 438/155 |
| 5,920,085 A | * | 7/1999 | Han et al. ..................... 257/66 |
| 6,081,308 A | * | 6/2000 | Jeong et al. ................... 349/42 |
| 6,310,670 B1 | * | 10/2001 | Lee .............................. 349/43 |

* cited by examiner

Primary Examiner—Keith Christianson
Assistant Examiner—Laura M Schillinger
(74) Attorney, Agent, or Firm—McGuireWoods LLP

(57) ABSTRACT

There is provided a method for manufacturing a thin film transistor. The present invention can reduce the number of process steps for manufacturing a thin film transistor, and also can lower contact resistance between layers. The manufacturing method deposits a buffer layer and an active layer on a substrate. The active layer is crystalized and patterned. Then, an insulating layer is deposited on an upper surface of the active layer and patterned to form a gate electrode on an upper surface of the insulating layer by a photolithography process using a photoresist layer. The photoresist layer covering the gate electrode is reflowed by heating and covers the edges of the gate electrode. A contact layer is formed by doping in high concentration at both edges of the active layer by plasma ion-injecting using the reflowed photoresist layer as a mask. After removing the photoresist layer, an LDD region is formed at the active layer by ion-injecting in low concentration. Then, an interlayer insulating layer is deposited on an upper surface of the gate electrode, exposing the contact layer by forming a contact hole at a predetermined portion of the interlayer insulating layer. A three-layered thin film of a first metal layer, an ITO layer and a second metal layer is sequentially deposited and patterned to form a source electrode, a drain electrode and a pixel electrode. A data line is formed on the second metal layer of the source electrode by an electroplating method.

6 Claims, 5 Drawing Sheets

METHOD FOR MANUFACTURING A THIN FILM TRANSISTOR

BACKGROUNDS OF THE INVENTION

1. Field of the Invention

The present invention relates to a method for manufacturing a thin film transistor, and more particularly to a method for manufacturing a thin film transistor having a transparent three-layered structure that can be simultaneously used as a source electrode, a drain electrode and a pixel electrode.

2. Description of the Prior Art

In a flat panel display, thin film transistors can improve the display quality by driving individual pixels. Thus, they have been widely used as on/off switching elements of pixels in a flat display device such as an active matrix liquid crystal displays. The thin film transistors used for that purpose should be able to withstand high voltages and have a high ratio of on-currents to off-currents. Also, when current is applied, the thin film transistors are affected by the resistance between metal and a polycrystalline silicon thin film and the contact resistance between layers.

Thin film transistors have two types. One is an amorphous silicon transistor and the other is a polycrystalline silicon transistors. The polycrystalline silicon transistor is favored more than the amorphous silicon transistor because of its high electron mobility and its reliability. However, the amorphous silicon transistors are practically used since layers of the polycrystalline silicon transistor should be formed at a high temperature atmosphere.

Most recently, a technology of easily forming the polycrystalline silicon on a cheap glass substrate by using the excimer laser equipment has been developed, drawing more attention to the polycrystalline silicon thin film transistors.

In the polycrystalline silicon transistor, a coplanar structure is preferred. The coplanar structure has electrodes, for instance, gate, source and drain electrodes arranged at both sides of a semiconductor. The coplanar structure is able to minimize the device size and is convenient to realize CMOS having PMOS and NMOS.

FIG. 1 illustrates a thin film transistor of the conventional coplanar structure.

In the drawing, a buffer layer 4 is formed on an upper surface of a substrate 2 by depositing an oxide layer. An active layer 6 of amorphous silicon is deposited and crystallized at a predetermined portion of the buffer layer 4.

After crystalizing the active layer 6, an insulating layer 8 is formed on the active layer 6. A gate metal layer is deposited on the insulating layer 8. The gate metal layer is patterned by a photolithography process to form a gate electrode 10.

Next, a contact layer 12 is formed at both edges of the active layer 6 by a high concentration ion doping method, thereby leaving an offset region 14 between the contact layers 12. A lightly doped drain (LDD) region is formed by doping the offset region 14 lightly using the gate electrode 10 as a mask.

Finally, an interlayer insulating layer 15 is deposited on an upper surface of the gate electrode 10. And then a contact hole that exposes the contact layer 12 is formed. Hereto, a source electrode or a drain electrode 16 is deposited and then patterned thereby completing a desired thin film transistor structure.

In the manufacturing process of the conventional thin film transistors as described above, the photolithography process should be conducted at the steps of defining the active layer; forming the gate electrode; doping n+; doping n−; doping p+; forming the contact hole; and forming the source/drain electrodes, as well as at subsequent steps of forming a via hole; forming a pixel electrode; and doping p channel.

However, as is well known, since the photolithography process comprises various steps of photoresist coating; mask-exposing; and developing/etching, the increased number of process steps may significantly lower the productivity and degrade the quality of the product. Accordingly, numerous suggestions to reduce the number of processes for manufacturing the thin film transistor have been made. Among the suggestions, the source and the drain electrodes are formed from the contact layer by filling an ITO layer, which simplifies the manufacturing process. However, it causes a problem of the contact resistance between the polycrystalline silicon thin film and the ITO layer at a boundary of the contact layer doped with high density.

Further, an RC delay may happen in a high resolution or a large size panel when a data line is used by the ITO layer that has a higher resistance than any of conventional metal electrode.

SUMMARY OF THE INVENTION

Accordingly, it is an object of the present invention to provide a method for manufacturing a thin film transistor that can reduce the number of process steps by using a three-layered thin film as a source electrode, a drain electrode and a pixel electrode simultaneously, and that can also lower the contact resistance between layers.

In order to accomplish the foregoing object, the present invention leaves the photoresist layer on the gate electrode after patterning the gate electrode. The photoresist layer is then reflowed by heating to cover the side edges of the gate electrode. Using the reflowed photoresist covering the side edges of the gate electrode, the substrate is doped with highly concentrated ions to form a contact layer. Then, after removing the reflowed photoresist layer, the substrate is doped with lightly concentrated ions to form a lightly doped drain. The interlayer insulating layer is deposited and a contact hole is formed. A three-layered thin film of a first metal layer, an indium tin oxide (ITO) layer, a second metal layer is deposited and a data line is formed on the second metal layer by an electroplating method.

In the present invention, the first metal layer is below 100 Å thick and preferably below 50 Å. The ITO layer is below 1000 Å thick and preferably below 600 Å. In addition, the second metal layer is below 100 Å thick and preferably below 50 Å.

A metal selected from the group consisting of Ag, Al and Au having low electric resistance, or their alloy can be used for the metal layers.

Since the thin film transistor of the present invention uses the three-layered thin film for all of the source, drain and pixel electrodes, patterning processes of forming a via hole and forming a pixel electrode can be omitted. Further, the present invention lowers the contact resistance between the ITO layer and the polycrystalline silicon thin film.

DETAILED DESCRIPTION OF THE PREFERRED EMBODIMENT

Hereinafter, a preferred embodiment of the manufacturing method according to the present invention will be discussed in detail with reference to the accompanying drawings.

FIGS. 2A through 2G are schematic cross-sectional views that show a method for manufacturing a thin film transistor according to the present invention.

Figure 1:
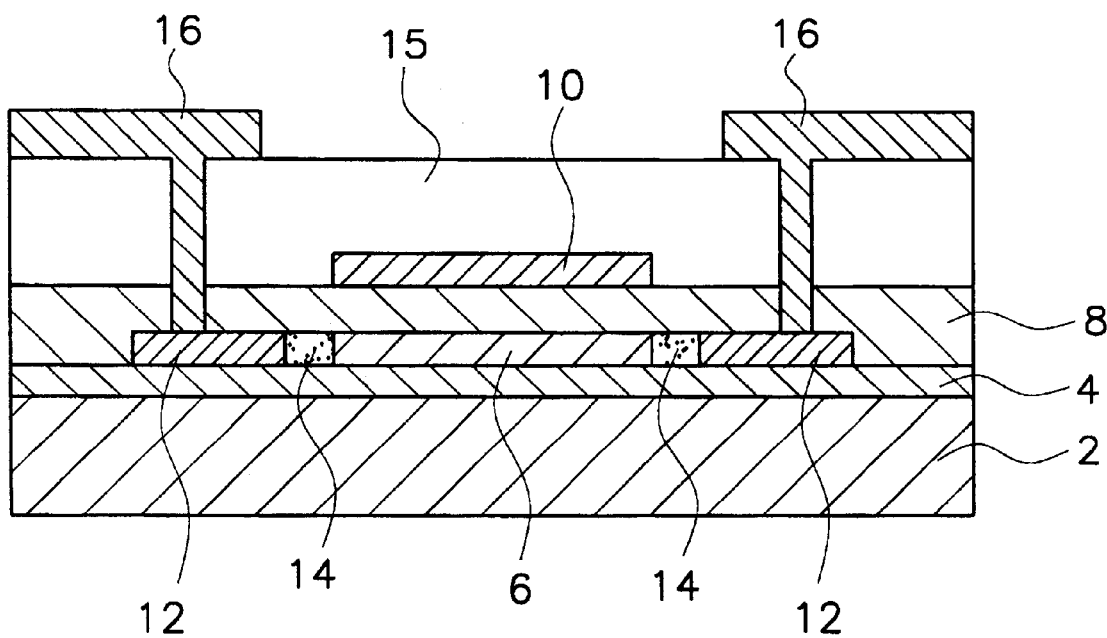
FIG. 1 is a cross-sectional view that shows a structure of a conventional coplanar polycrystalline silicon thin film transistor.
Figure 2A:
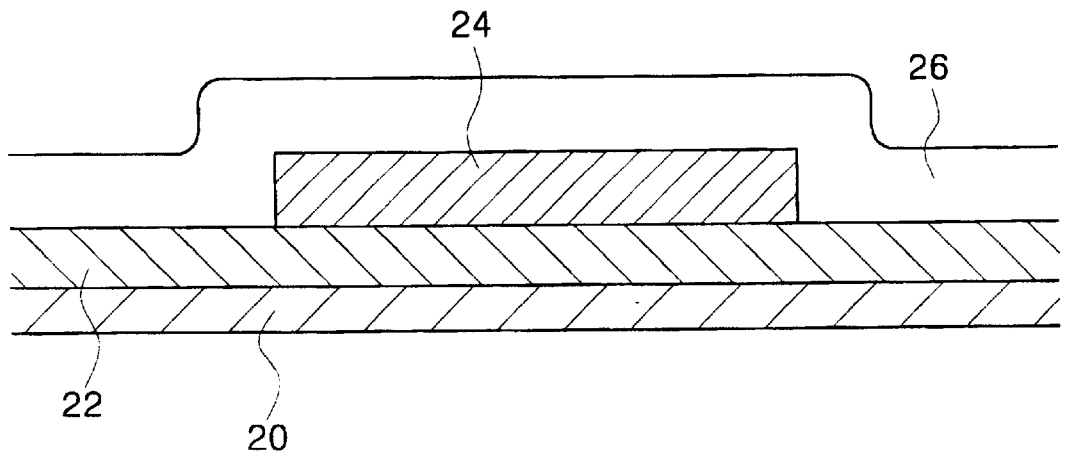
FIGS. 2A through 2G illustrate cross-sectional views of a portion of a thin film transistor as it undergoes sequential processing steps according to the present invention.

Referring to FIG. 2A, a buffer layer 22 and an active layer 24 is deposited on a substrate 20 successively. The buffer layer 22 is made of $SiO_2$ and deposited to a thickness of 2000 Å. The active layer 24 is formed by depositing amorphous silicon to a thickness of 500–700 Å and crystallizing it by a laser or by a solid phase growing method. After the active layer 24 is formed, a gate insulating layer 26 is deposited on the active layer 24. The $SiO_2$ or $SiN_x$ ($1 \leq x \leq 4$) is generally used for the gate insulating layer 26.

Figure 2B:
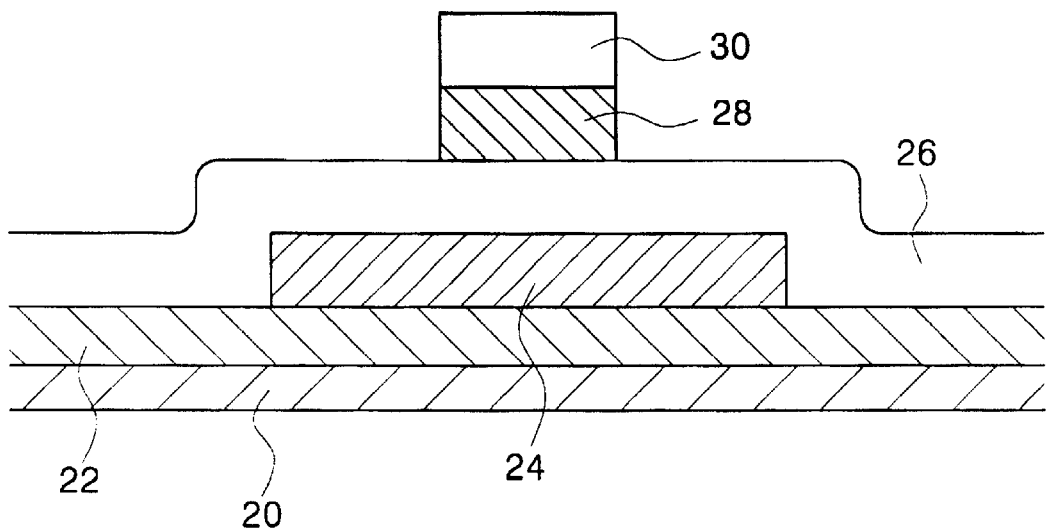

Next, as shown in FIG. 2B, a gate electrode 28 made of Al, polycrystalline silicon, Ta or Mo is formed on a predetermined portion of the gate insulating layer 26. The gate electrode 28 is formed by a photolithography with a photoresist layer 30.

Figure 2C:
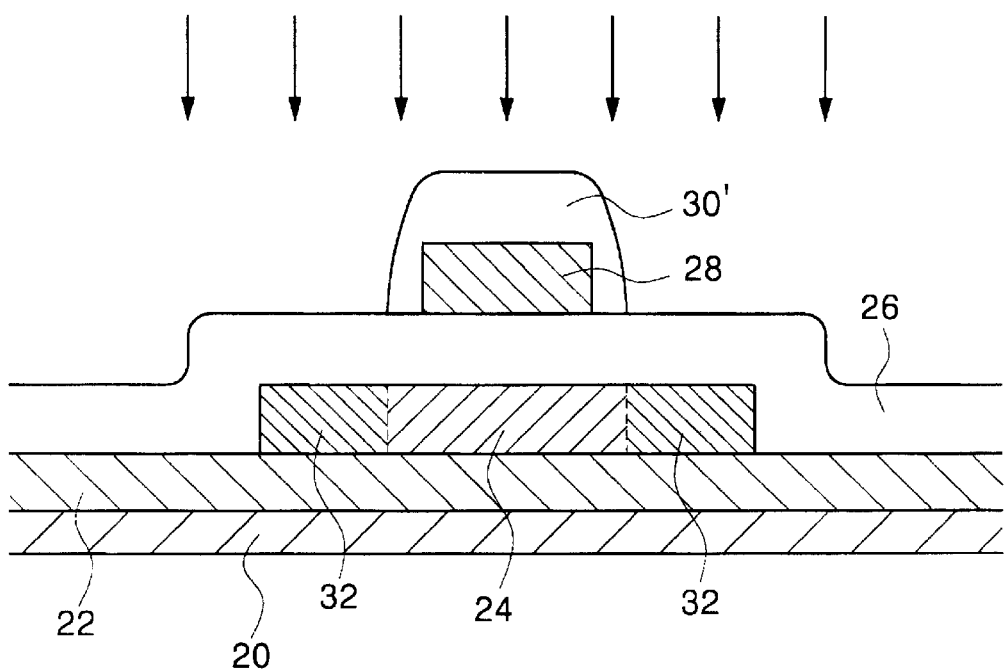

The photoresist layer 30 used in forming the gate electrode 28 is not removed, but heated to reflow. Then, as shown in FIG. 2C, the photoresist layer 30 is melted down to lateral positions and is covered on the side surfaces of the gate electrode 28. Then, highly concentrated ions are injected at both edges of the active layer 24 by a plasma ion-injecting method to form a contact layer 32.

Figure 2D:
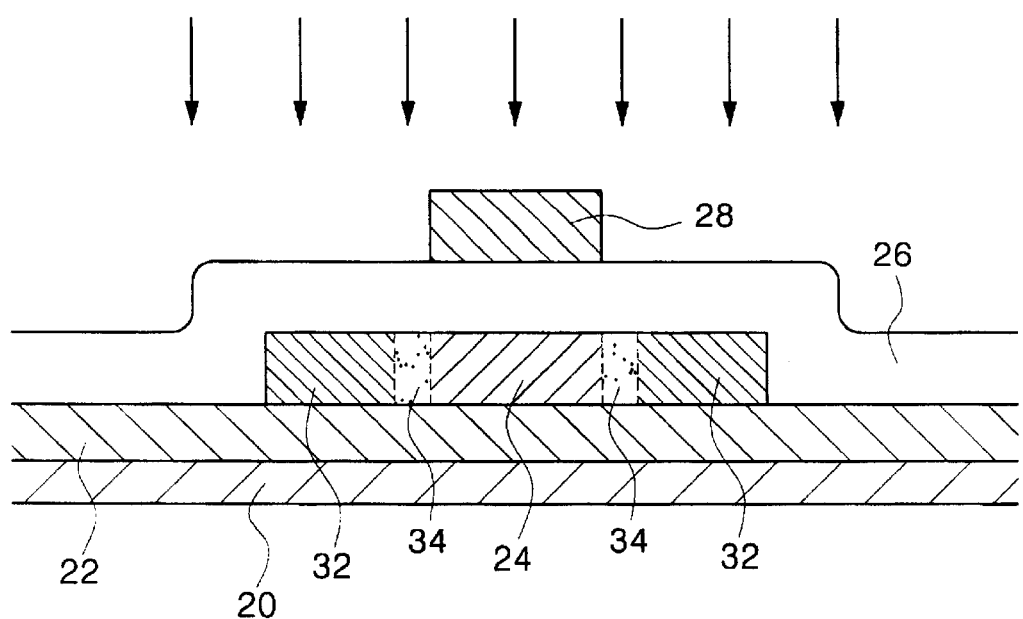

Next, when a reflowed photoresist layer 30' is removed as shown in FIG. 2d, a portion of the active layer 24 shielded by the reflowed photoresist layer 30' is exposed, and the exposed portion of the active layer 24 becomes a lightly doped drain (LDD) region 34 by ion-injecting again with low concentration.

Figure 2E:
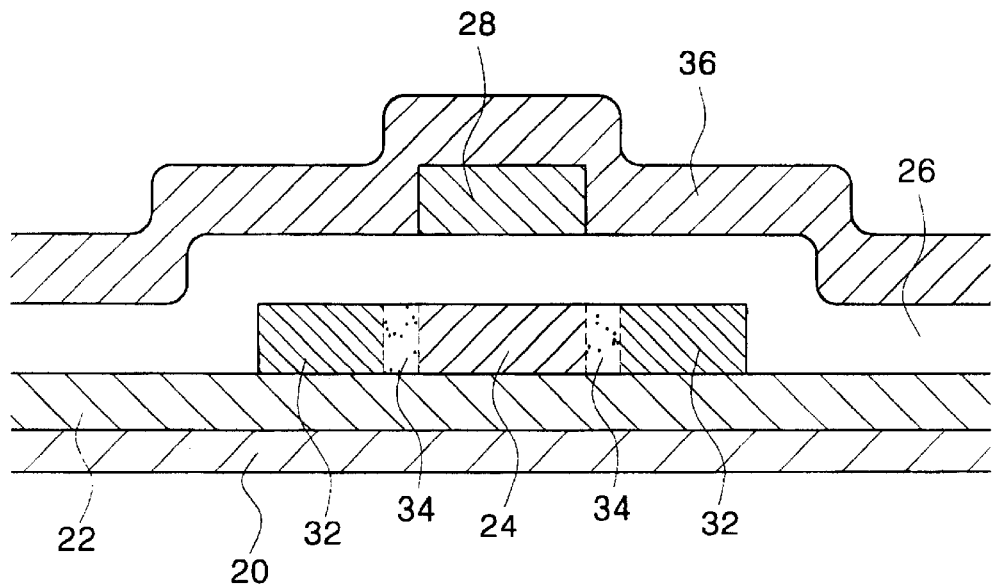
Figure 2F:
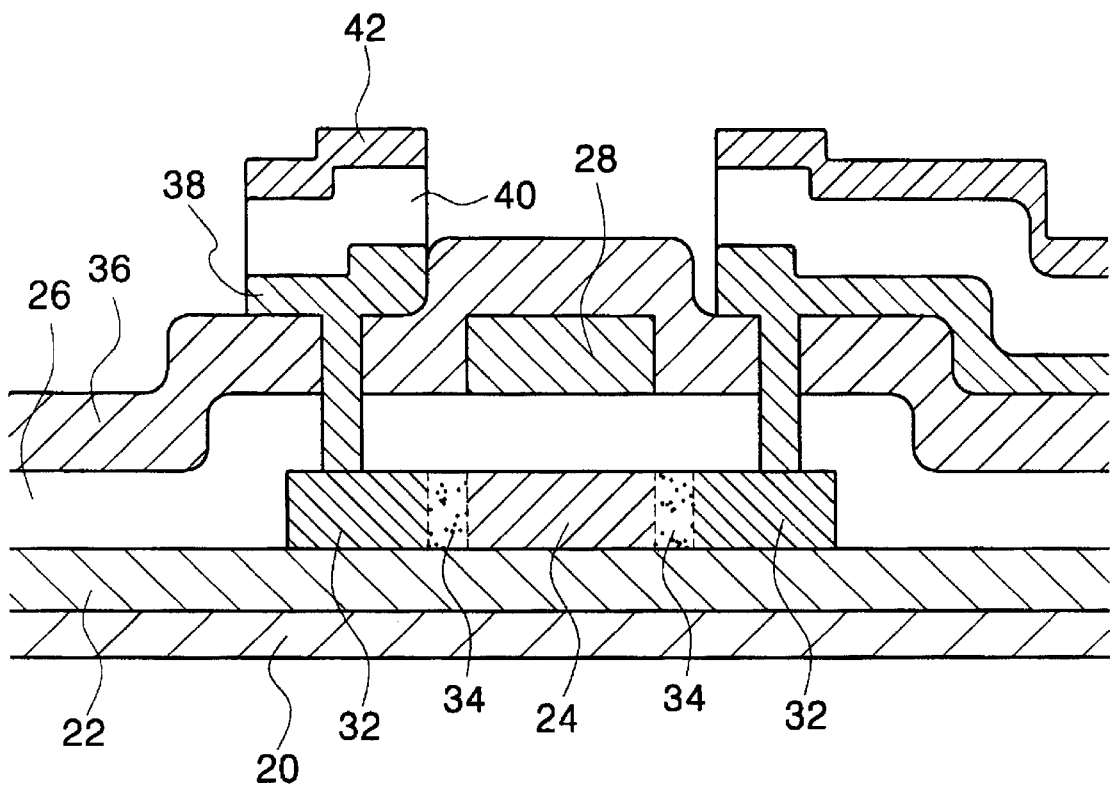
Figure 2G:
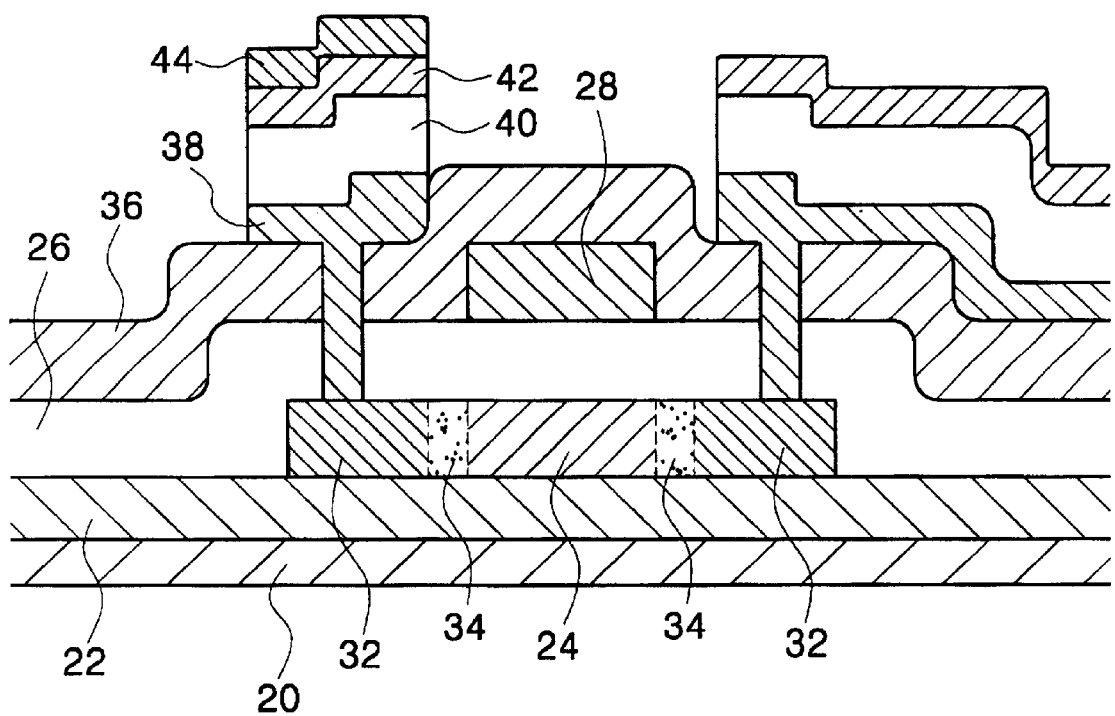

Afterward, as shown in FIG. 2E, an interlayer insulting layer 36 is deposited to cover the gate electrode 28. The interlayer insulating layer 36 is also made of $SiN_x$ ($1 \leq x \leq 4$) or $SiO_2$. A contact hole is formed at a predetermined portion of the interlayer insulating layer 36 by a photolithography. Finally, a first metal layer 38, an ITO layer 40 and a second metal layer 42 are sequentially deposited and patterned on the contact hole. Preferably, the first metal layer 38 is made of one selected from Ag, Al and Au and is deposited to a thickness of below 50 Å. The second metal layer 42 is made of one selected from Ag, Al and Au and is deposited to a thickness of below 50 Å. In addition, the ITO layer 40 is formed to a thickness of approximately 400 Å. Accordingly, source, drain and pixel electrodes are formed with the gate electrode 28 therebetween.

Herein, the first metal layer 38 is formed as a thin film, preferably below 50 Å for the sake of transmittance. Furthermore, the second metal layer 42 is designed to coat metal easily during an electroplating process to be described subsequently, and is formed with a thickness of below 50 Å.

Meanwhile, three layers of thin films, i.e., a first metal layer/an ITO layer/a second metal layer, are sequentially deposited and patterned to form a source electrode, a drain electrode and a pixel electrode. More particularly, the first metal layer acts as the source electrode or the drain electrode, and the ITO layer acts as the pixel electrode. The conventional mask process for making a via hole to connect the drain and the pixel electrodes separated by an interlayer insulating layer is well known in the art, and the detailed explanation on it is omitted.

Furthermore, as the three-layered thin film is patterned at once, the source electrode, the drain electrode and the pixel electrode are simultaneously defined. Therefore, the conventional two mask processes, one for patterning the source electrode and the drain electrode and the other for the pixel electrode can be reduced to one process.

Moreover, another feature of the present invention is to use the electroplating method for depositing the data line 44 on the second metal layer 42. The electroplating method is performed by charging metal sticks immersed in electrolyte. When the sticks are charged, current is applied selectively to portions of the source electrode where the data line 44 is connected, thereby coating the metal layer. Therefore, the resistance in the data line 44 can easily be lowered, thereby minimizing the RC delay. Here, in the present invention, although it has been described that the data line is formed in the source electrode, the data line may be formed in the data electrode.

Also, in the present invention, the three-layered thin film structure of the first metal layer/the ITO layer/the second metal layer is described. However, a two-layered thin film structure of the first metal layer/the ITO layer can be adopted, and the second metal layer can be coated selectively on the source electrode or on the drain electrode. Subsequent manufacturing method of the data line at the second metal layer according to the electroplating method is identical to the foregoing descriptions.

As a result, by using the three-layered thin film in the present invention, the contact resistance between the polycrystalline thin film with high doping of the source and drain contact regions and the ITO layer, and between the ITO layer and the data line can be lowered as well as the data line resistance by employing the electroplating method. Furthermore, since the metal layers is really thin, the metal layers have transparent conductor characteristics, thereby obtaining approximately 90% of light transmittance.

As described above, according to the present invention, the photolithography process in the manufacturing steps can be omitted by using a three-layered thin film to form all of a source electrode, a drain electrode and a pixel electrode simultaneously after forming a contact hole.

Further, since the contact resistance between layers and the line resistance of the data line can be lowered it is possible to solve the RC delay problem that may occur when manufacturing a high resolution panel or a large-sized panel.

What is claimed is:

1. A method for manufacturing a thin film transistor, comprising the steps of:

depositing and crystallizing an active layer on a substrate; patterning the active layer;

depositing an insulating layer on an upper surface of the active layer and forming a gate electrode on an upper surface of the insulating layer by a photolithography process using a photoresist layer;

covering side surfaces of the gate electrode by heating the photoresist layer deposited on the gate electrode to reflow;

forming a highly doped contact layer at both edges of the active layer by plasma ion-injecting using the covered gate electrode as a mask;

forming a lightly doped drain region at the active layer by ion-injection in low concentration after removing the photoresist layer;

depositing an interlayer insulating layer on an upper surface of the gate electrode;

exposing the contact layer by forming a contact hole at a predetermined portion of the interlayer insulating layer;

depositing a three-layered thin film of a first metal layer, an ITO layer, and a second metal layer;

patterning the three-layered thin film to form a source electrode, a drain electrode and a pixel electrode; and forming a data line on the second metal layer by an electroplating method.

2. The method according to claim 1, wherein the first metal layer is selected from the group consisting of Ag, Al and Au, or their alloy.

3. The method according to claim 1, wherein the second metal layer is selected from the group consisting of Ag, Al and Au, or their alloy.

4. The method according to claim 1, wherein the first metal layer is thinner than 100 Å.

5. The method according to claim 1, wherein the ITO layer is thinner than 1000 Å.

6. The method according to claim 1, wherein the second metal layer is thinner than 100 Å.

* * * * *